(12) United States Patent
Nam

(10) Patent No.: US 11,847,340 B2
(45) Date of Patent: Dec. 19, 2023

(54) HOST, MEMORY SYSTEM COMMUNICATING WITH THE HOST, AND COMPUTING SYSTEM INCLUDING THE HOST AND MEMORY SYSTEM

(71) Applicant: SK hynix Inc., Gyeonggi-do (KR)

(72) Inventor: Yun Seung Nam, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/400,697

(22) Filed: Aug. 12, 2021

(65) Prior Publication Data
US 2022/0283730 A1 Sep. 8, 2022

(30) Foreign Application Priority Data
Mar. 3, 2021 (KR) .......... 10-2021-0028430

(51) Int. Cl.
*G06F 3/06* (2006.01)
*G11C 16/10* (2006.01)
(Continued)

(52) U.S. Cl.
CPC .......... *G06F 3/0655* (2013.01); *G06F 3/0604* (2013.01); *G06F 3/0679* (2013.01);
(Continued)

(58) Field of Classification Search
CPC ...... G05B 13/00–048; G05B 15/00–02; G05B 17/00–02; G06F 1/00–3296;
(Continued)

(56) References Cited

U.S. PATENT DOCUMENTS 5,822,251 A * 10/1998 Bruce ............... G06F 13/28
714/E11.038
7,761,717 B2 * 7/2010 Moller ............ G06F 21/572
709/215

(Continued)

FOREIGN PATENT DOCUMENTS

KR 10-1605824 B1 4/2016
KR 10-2017-0100724 A 9/2017

OTHER PUBLICATIONS

M. Lukka, S. Nakhate and S. G. Dastidar, "Review on BIST architectures of DRAMs," 2023 IEEE International Students' Conference on Electrical, Electronics and Computer Science (SCEECS), Bhopal, India, 2023, pp. 1-4, doi: 10.1109/SCEECS57921.2023. 10063015. (Year: 2023).*

(Continued)

*Primary Examiner* — Daniel C. Chappell
(74) *Attorney, Agent, or Firm* — IP & T GROUP LLP

(57) ABSTRACT

A memory system includes a semiconductor memory device including a plurality of memory cells, and a controller configured to control an operation of the semiconductor memory device and communicate with a host. The controller includes a condition storage, a condition monitor, and a host interface. The condition storage stores at least one condition related to an internal state of the memory system. The condition monitor monitors whether the at least one condition is satisfied, and outputs a confirmation signal when the at least one condition is satisfied. The host interface outputs a condition confirmation message indicating that the at least one condition is satisfied to the host, in response to the confirmation signal.

19 Claims, 12 Drawing Sheets

(51) Int. Cl.
*G11C 16/04* (2006.01)
*G11C 16/26* (2006.01)

(52) U.S. Cl.
CPC .......... *G11C 16/0483* (2013.01); *G11C 16/10* (2013.01); *G11C 16/26* (2013.01)

(58) Field of Classification Search
CPC .............. G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06K 9/00–6298; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 27/00–3293; H01L 2225/00–1094; H03M 7/00–707; H04L 9/00–38; H04L 12/00–66; H04L 41/00–5096; H04L 49/00–9094; H04L 61/00–59; H04L 67/00–75
See application file for complete search history.

(56) References Cited

U.S. PATENT DOCUMENTS

| | | | | |
|---|---|---|---|---|
| 8,358,545 | B2 * | 1/2013 | Sako | G11C 29/82 |
| | | | | 365/185.21 |
| 9,829,532 | B2 * | 11/2017 | Kobashi | G06F 3/0614 |
| 11,373,823 | B2 * | 6/2022 | Sakai | H01H 39/006 |
| 2004/0199843 | A1 * | 10/2004 | Hansquine | G11C 29/16 |
| | | | | 714/733 |
| 2006/0168491 | A1 * | 7/2006 | Lee | G11C 29/16 |
| | | | | 714/733 |
| 2007/0174835 | A1 * | 7/2007 | Xu | G06F 9/4416 |
| | | | | 717/176 |
| 2008/0061792 | A1 * | 3/2008 | Hsiung | G01N 27/4167 |
| | | | | 324/438 |
| 2020/0088790 | A1 * | 3/2020 | Balun | G01R 31/31724 |
| 2020/0201563 | A1 * | 6/2020 | Nam | G06F 3/0604 |
| 2022/0253395 | A1 * | 8/2022 | Nguyen | G06F 13/387 |

OTHER PUBLICATIONS

A. Fradi, M. Nicolaidis and L. Anghel, "Memory BIST with address programmability," 2011 IEEE 17th International On-Line Testing Symposium, Athens, Greece, 2011, pp. 79-85, doi: 10.1109/IOLTS. 2011.5993815. (Year: 2011).*

P. Bernardi, G. Filipponi, M. S. Reorda, D. Appello, C. Bertani and V. Tancorre, "Collecting diagnostic information through dichotomic search from Logic BIST of failing in-field automotive SoCs with delay faults," 2023 DDECS, Tallinn, Estonia, 2023, pp. 21-26, doi: 10.1109/DDECS57882.2023.10139670. (Year: 2023).*

X. Du, N. Mukherjee, C. Hill, W.-t. Cheng and S. Reddy, "A Field Programmable Memory BIST Architecture Supporting Algorithms with Multiple Nested Loops," 2006 15th Asian Test Symposium, Fukuoka, Japan, 2006, pp. 287-292, doi: 10.1109/ATS.2006. 261033. (Year: 2006).*

* cited by examiner

HOST, MEMORY SYSTEM COMMUNICATING WITH THE HOST, AND COMPUTING SYSTEM INCLUDING THE HOST AND MEMORY SYSTEM

CROSS-REFERENCE TO RELATED APPLICATION

The present application claims priority under 35 U.S.C. § 119(a) to Korean patent application number 10-2021-0028430 filed on Mar. 3, 2021, the entire disclosure of which is incorporated by reference herein.

BACKGROUND

Field of Invention

The present disclosure relates to an electronic device, and more particularly, to a host, a memory system communicating with the host, and a computing system including the host and the memory system.

Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional semiconductor memory device is a semiconductor memory device designed to resolve a limit of an integration degree of a two-dimensional semiconductor memory device, and may include a plurality of memory cells that are vertically stacked on a semiconductor substrate. A controller may control an operation of the semiconductor memory device. A memory system may include the semiconductor memory device and the controller, and communicate with a host. The host and the memory system may configure a computing system.

SUMMARY

An embodiment of the present disclosure provides a memory system capable of efficiently transferring an internal state to a host.

Another embodiment of the present disclosure provides a host capable of efficiently grasping an internal state of a memory system.

Still another embodiment of the present disclosure provides a computing system capable of efficiently transferring an internal state of a memory system to a host.

According to an embodiment of the present disclosure, a memory system includes a semiconductor memory device including a plurality of memory cells, and a controller configured to control an operation of the semiconductor memory device and communicate with a host. The controller includes a condition storage, a condition monitor, and a host interface. The condition storage stores at least one condition related to an internal state of the memory system. The condition monitor monitors whether the at least one condition is satisfied, and outputs a confirmation signal when the at least one condition is satisfied. The host interface outputs, to the host, a condition confirmation message indicating that the at least one condition is satisfied, in response to the confirmation signal.

In an embodiment of the present disclosure, the at least one condition may be provided from the host and stored in the condition storage.

In an embodiment of the present disclosure, the at least one condition may be stored in the condition storage when the memory system is manufactured.

In an embodiment of the present disclosure, the controller may further include a code storage configured to store at least one code, and a code executer configured to execute the at least one code.

In an embodiment of the present disclosure, the host interface may include a first port and a second port. The first port may exchange data of a first type and a command with the host. The second port may exchange data of a second type with the host. The controller may output the condition confirmation message through the second port.

In an embodiment of the present disclosure, the host interface may be further configured to receive, from the host through the first port, a command for identifying a code to be executed which corresponds to the satisfied condition, and output a control signal for controlling the code executer to execute the code identified by the command.

In an embodiment of the present disclosure, the code executer may execute the code identified by the command in response to the control signal. In addition, the code executer may be further configured to transmit, to the host interface, a result of the executing the code.

In an embodiment of the present disclosure, the host interface may be further configured to transmit an execution result message indicating the result of executing the code to the host through the first port.

In an embodiment of the present disclosure, the result of executing the code may indicate a success or a failure of executing the code.

In an embodiment of the present disclosure, the second port may configure a communication link with the host. The communication link may use a universal asynchronous receiver/transmitter (UART) protocol.

According to another embodiment of the present disclosure, a method of operating a host exchanging data of a first type and a command through a first link with a memory system, includes a first message indicating that a condition related to an internal state of the memory system is satisfied is received, from the memory system through a second link different from the first link, a code to be executed by the memory system is determined in response to the first message, and a command identifying the code is transmitted to the memory system through the first link.

In an embodiment of the present disclosure, the code may be for performing a test operation of the memory system.

In an embodiment of the present disclosure, the method may further include receiving, from the memory system through the first link, a second message indicating an execution result of the code.

In an embodiment of the present disclosure, the second link may use a universal asynchronous receiver/transmitter (UART) protocol.

According to still another embodiment of the present disclosure, a method of operating a memory system communicating with a host through a first link for transmitting and receiving data of a first type and a command, and a second link for transmitting and receiving data of a second type, includes detecting at least one condition is satisfied with respect to the memory system, and transmitting, to the host through the second link, a first message indicating the detected condition.

In an embodiment of the present disclosure, the method may further include transmitting, to the host through the first link, the data of the first type in response to a command of the host associated with the data of the first type.

In an embodiment of the present disclosure, the method may further include transmitting, to the host through the second link, the data of the second type without responding to a command of the host associated with the data of the second type.

In an embodiment of the present disclosure, the method may further include receiving a command corresponding to the message transmitted to the host from the host through the first link, executing a code corresponding to the received command, and transmitting a message indicating an execution result of the code to the host through the first link.

In an embodiment of the present disclosure, the execution result may indicate an execution success or an execution failure of the code.

In an embodiment, the second link may use a universal asynchronous receiver/transmitter (UART) protocol.

According to still another embodiment of the present disclosure, an operating method of a system includes providing the host with a message for causing an operation, and performing, in response to a request provided from the host, the operation to provide the host with a result of the operation. The message may be provided through a second link according to a universal asynchronous receiver/transmitter (UART) protocol. The request and the result are provided through a first link.

The present technology may provide a memory system capable of efficiently transferring an internal state to a host. In addition, the present technology may provide a host capable of efficiently grasping the internal state of the memory system. Moreover, the present technology may provide a computing system capable of efficiently transferring the internal state of the memory system to the host.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and should not be construed as being limited to the embodiments described in the present specification.

Figure 1:
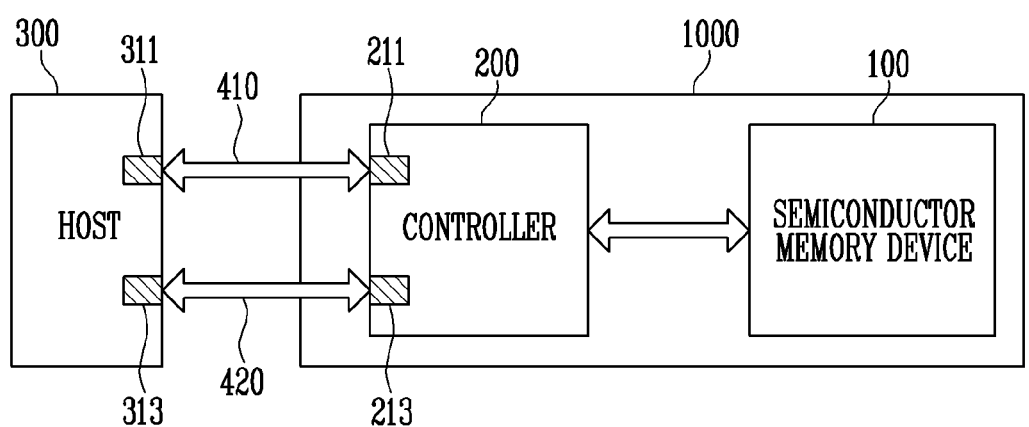
FIG. 1 is a block diagram illustrating a memory system including a controller according to an embodiment of the present disclosure.

FIG. 1 is a block diagram illustrating a memory system 1000 including a controller according to an embodiment of the present disclosure.

Referring to FIG. 1, the memory system 1000 includes a semiconductor memory device 100 and a controller 200. In addition, the memory system 1000 communicates with a host 300. The controller 200 controls an overall operation of the semiconductor memory device 100. In addition, the controller 200 controls the operation of the semiconductor memory device 100 based on a command received from the host 300. The host 300 and the memory system 1000 communicating with the host 300 may configure a computing system.

According to an embodiment of the present disclosure, the memory system 1000 and the host 300 may communicate with each other through a first link 410. More specifically, the host 300 may transmit a command and data to the memory system 1000 through the first link 410. For example, the host 300 may transmit write data and a write command for storing the write data to the memory system 1000 through the first link 410. The memory system 1000 may perform a write operation on the write data in response to the write command. In addition, the host 300 may transmit a read command for reading data to the memory system 1000 through the first link 410. Moreover, the memory system 1000 may perform a read operation in response to the read command and transmit the read data to the host 300 through the first link 410. The first link 410 may include a first device port 211 included in the controller 200 of the memory system 1000 and a first host port 311 included in the host 300. The first link 410 may use a protocol defined to transmit and receive the command and the data, for example, user data between the host 300 and the memory system 1000.

According to an embodiment of the present disclosure, the memory system 1000 and the host 300 may also communicate with each other through a second link 420. The second link 420 may be used to transmit log data and debugging data. The second link 420 may include a second device port 213 included in the controller 200 of the memory system 1000 and a second host port 313 included in the host 300.

In order for the memory system 1000 to transmit the data to the host 300 through the first link 410, a command from the host 300 may be required. This means that data may not be transmitted to the host 300 through the first link 410 by determination of the memory system 1000 without a command from the host 300. The memory system 1000 may transmit the data to the host 300 through the first link 410, in a form of a response to the command received from the host 300 through the first link 410.

When the memory system 1000 transmits the data to the host 300 through the second link 420, a command from the host 300 may not be required. That is, an operation of transmitting the data from the memory system 1000 to the host 300 through the second link 420 is not performed in a form of a response to the command or a request from the host 300. Therefore, even though the command or the request from the host 300 does not exist, the memory system 1000 may transmit specific data to the host 300.

As described above, the transmission of the data through the first link 410 and the second link 420 may be performed in different methods. That is, transmission protocols used in the first link 410 and the second link 420 may be different from each other.

For example, the first link 410 may use a universal serial bus (USB) protocol, a multimedia card (MMC) protocol, a peripheral component interconnection (PCI) protocol, a PCI-express (PCI-e or PCIe) protocol, and the like for performing data exchange between the host 300 and the memory system 1000. However, these are examples, and various other data transmission/reception protocols may be used for the first link 410.

The second link 420 may use a universal asynchronous receiver/transmitter (UART) protocol. The UART is a type of computer hardware that transmits data by converting a parallel data form to a serial data form. The UART may generally be used with communication standards such as EIA RS-232, RS-422, and RS-485. Since the UART is asynchronous communication, a synchronous signal is not transmitted. Therefore, a receiving side may determine a synchronization signal and process a start and an end of data in time. Through this, even though the command or the request from the host 300 does not exist, the memory system 1000 may transmit the data to the second link 420.

Figure 2:
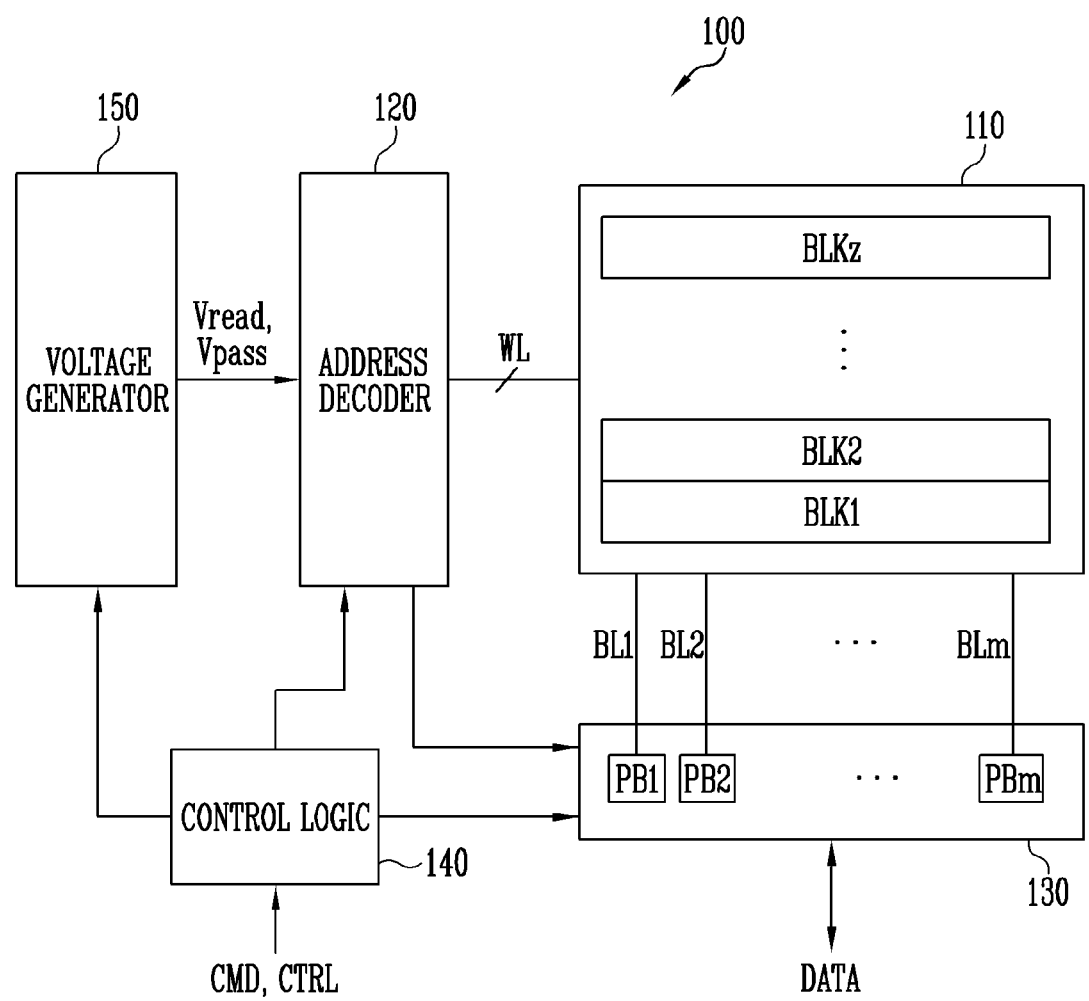
FIG. 2 is a block diagram illustrating a semiconductor memory device of FIG. 1, according to an embodiment of the present disclosure.

FIG. 2 is a block diagram illustrating the semiconductor memory device 100 of FIG. 1, according to an embodiment of the present disclosure.

Referring to FIG. 2, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated by the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140. As described above, the voltage generator 150 may include the charge pump, and the charge pump may include the plurality of pumping capacitors described above. A specific configuration of the charge pump included in the voltage generator 150 may be variously designed as necessary.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 3:
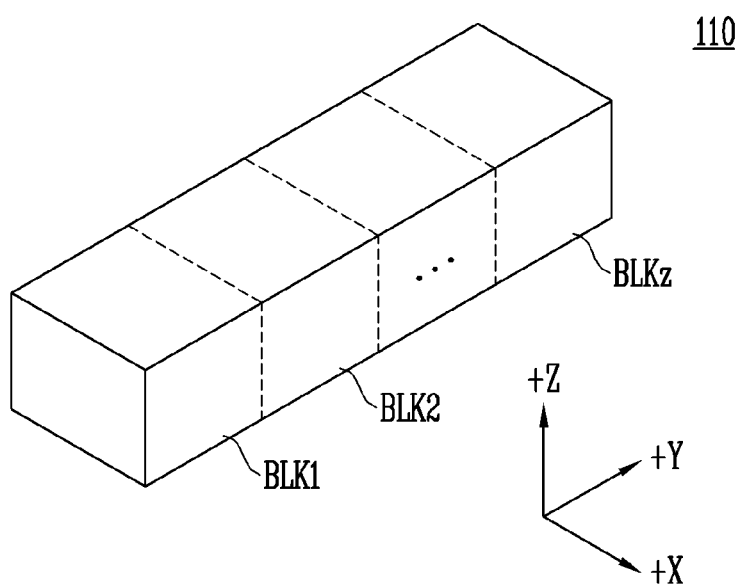
FIG. 3 is a diagram illustrating a memory cell array of FIG. 2, according to an embodiment of the present disclosure.

FIG. 3 is a diagram illustrating the memory cell array 110 of FIG. 2, according to an embodiment of the present disclosure.

Referring to FIG. 3, the memory cell array 110 includes a plurality of memory blocks BLK1 to BLKz. Each memory block may have a three-dimensional structure. Each memory block includes a plurality of memory cells stacked on a substrate. The plurality of memory cells are arranged along a +X direction, a +Y direction, and a +Z direction. A structure of each memory block is described in more detail with reference to FIGS. 4 and 5.

Figure 4:
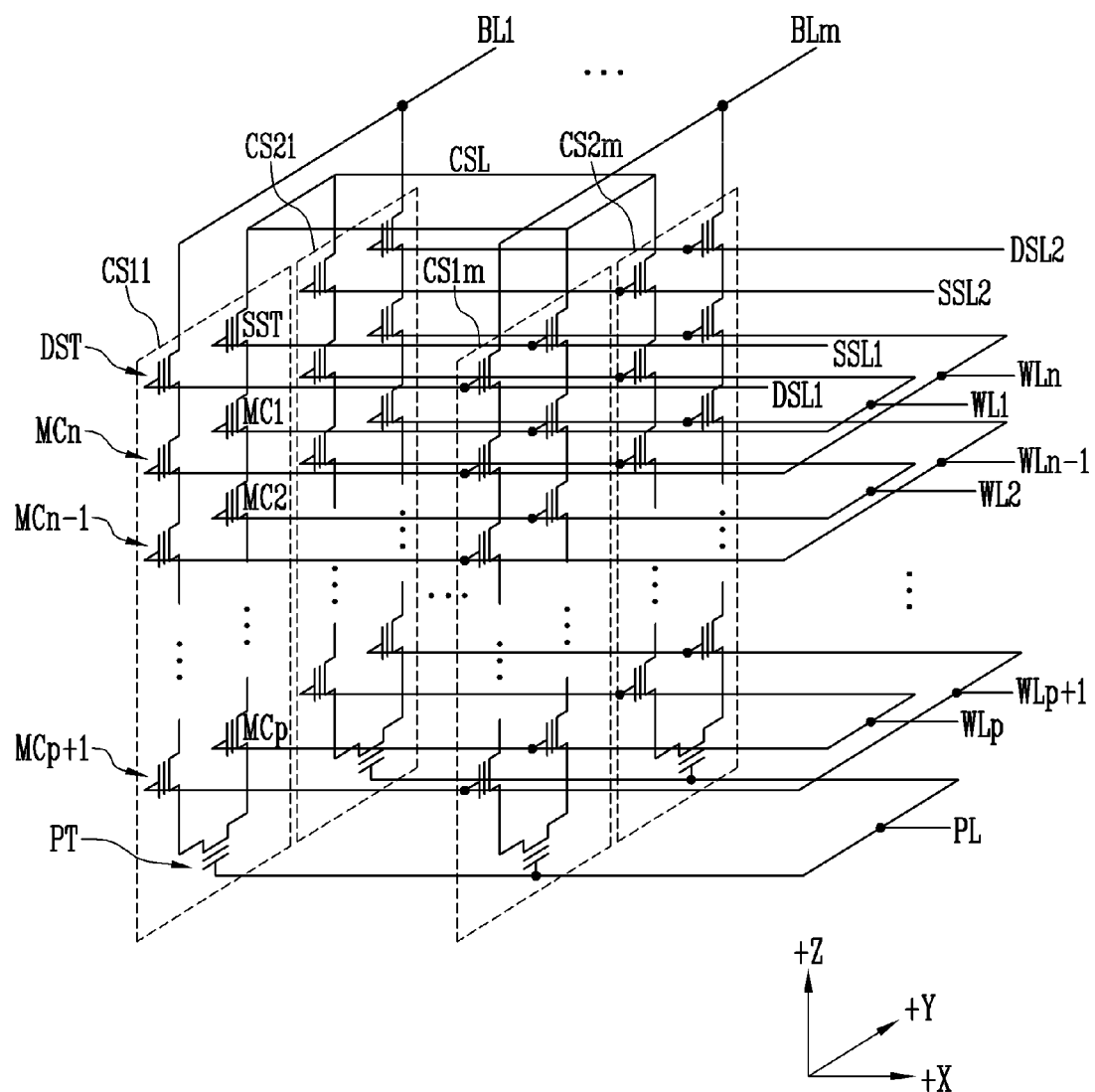
FIG. 4 is a circuit diagram illustrating a memory block BLKa among memory blocks BLK1 to BLKz of FIG. 3, according to an embodiment of the present disclosure.

FIG. 4 is a circuit diagram illustrating a memory block BLKa among the memory blocks BLK1 to BLKz of FIG. 3 according to an embodiment of the present disclosure.

Referring to FIG. 4, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction, that is, the +X direction. In FIG. 4, two cell strings are arranged in a column direction, that is, the +Y direction. However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1$m$ and CS2$m$ of the m-th column are connected to the m-th bit line BL$m$.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any of the drain select lines DSL1 and DSL2. One page of the selected cell strings may be selected by selecting any of the word lines WL1 to WL$n$.

In another embodiment, even bit lines and odd bit lines may be provided instead of the first to m-th bit lines BL1 to BL$m$. In addition, even-numbered cell strings among the cell strings CS11 to CS1$m$ or CS21 to SC2$m$ arranged in the row direction may be connected to the even bit lines, and odd-numbered cell strings among the cell strings CS11 to CS1$m$ or CS21 to CS2$m$ arranged in the row direction may be connected to odd bit lines, respectively.

In an embodiment, at least one of the first to n-th memory cells MC1 to MC$n$ may be used as a dummy memory cell. For example, at least one dummy memory cell is provided to reduce an electric field between the source select transistor SST and the memory cells MC1 to MC$p$. Alternatively, at least one dummy memory cell is provided to reduce an electric field between the drain select transistor DST and the memory cells MC$p$+1 to MC$n$. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
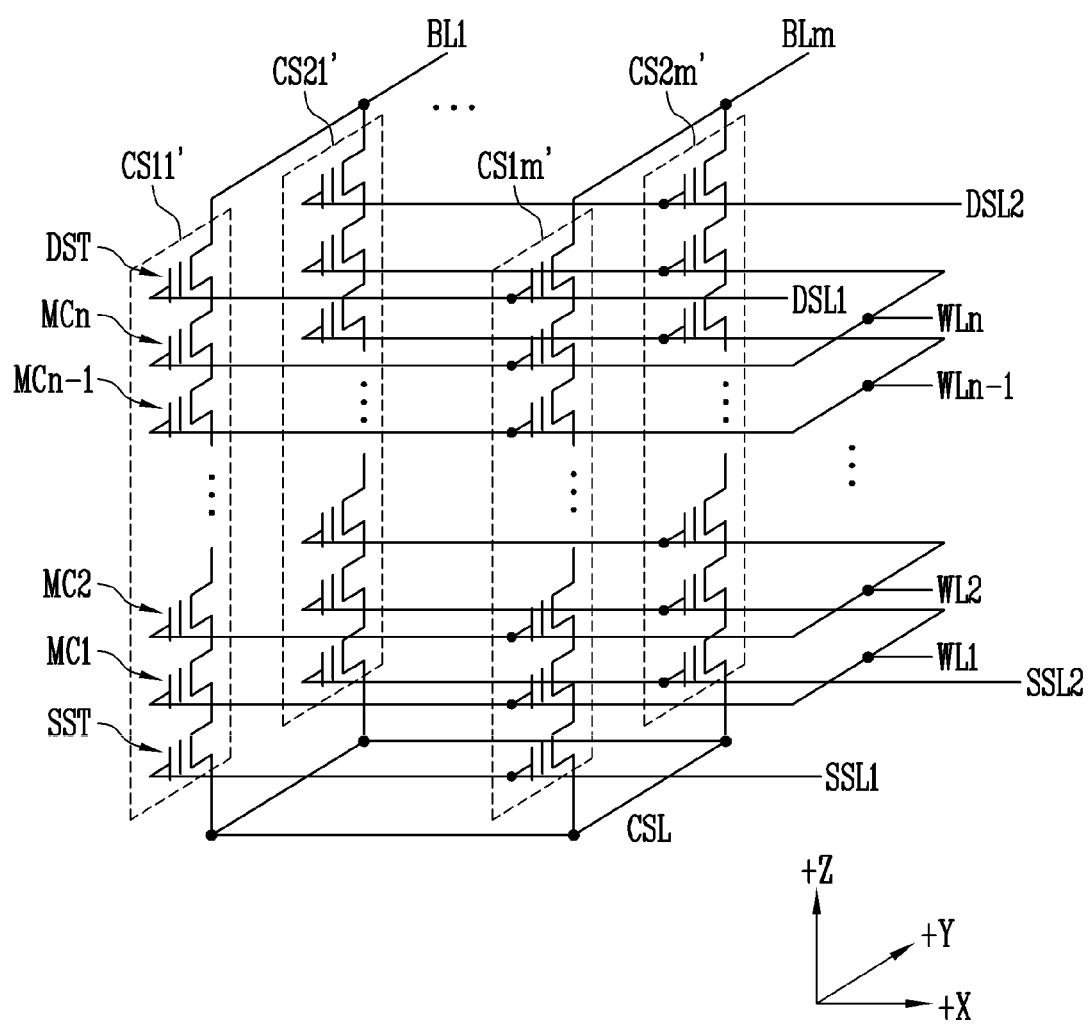
FIG. 5 is a circuit diagram illustrating another memory block BLKb among the memory blocks BLK1 to BLKz of FIG. 3, according to an embodiment of the present disclosure.

FIG. 5 is a circuit diagram illustrating another memory block BLKb among the memory blocks BLK1 to BLK$z$ of FIG. 3 according to an embodiment of the present disclosure.

Referring to FIG. 5, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MC$n$, and at least one drain select transistor DST stacked on a substrate (not shown) under the memory block BLKb.

The source select transistor SST of each cell string is connected between a common source line CSL and memory cells MC1 to MC$n$. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. In another embodiment, the source select transistors of the cell strings CS11' to CS1$m$' and CS21' to CS2$m$' may be commonly connected to one source select line.

The first to n-th memory cells MC1 to MC$n$ of each cell string are connected in series between the source select transistor SST and the drain select transistor DST. Gates of the first to n-th memory cells MC1 to MC$n$ are connected to first to the n-th word lines WL1 to WL$n$, respectively.

The drain select transistor DST of each cell string is connected between a corresponding bit line and the memory cells MC1 to MC$n$. The drain select transistors of the cell strings arranged in the row direction are connected to a drain select line extending in the row direction. The drain select transistors of the cell strings CS11' to CS1$m$' of a first row are connected to a first drain select line DSL1. The drain select transistors of the cell strings CS21' to CS2$m$' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

In another embodiment, even bit lines and odd bit lines may be provided instead of the first to m-th bit lines BL1 to BL$m$. In addition, even-numbered cell strings among the cell strings CS11' to CS1$m$' or CS21' to CS2$m$' arranged in the row direction may be connected to even bit lines, and odd-numbered cell strings among the cell strings CS11' to CS1$m$' or CS21' to CS2$m$' arranged in the row direction may be connected to odd bit lines, respectively.

In an embodiment, at least one of the first to n-th memory cells MC1 to MC$n$ may be used as a dummy memory cell. For example, at least one dummy memory cell is provided to reduce an electric field between the source select transistor SST and the memory cells MC1 to MC$n$. Alternatively, at least one dummy memory cell is provided to reduce an electric field between the drain select transistor DST and the memory cells MC1 to MC$n$. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
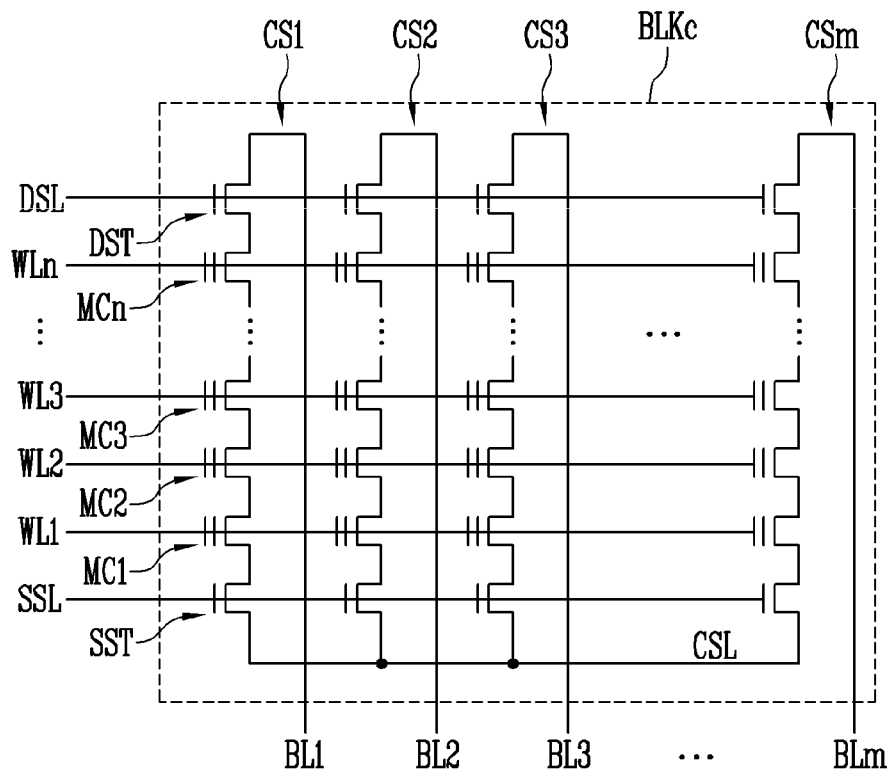
FIG. 6 is a circuit diagram illustrating a memory block BLKc among the memory blocks BLK1 to BLKz included in a memory cell array 110 of FIG. 2, according to an embodiment of the present disclosure.

FIG. 6 is a circuit diagram illustrating a memory block BLKc among the memory blocks BLK1 to BLK$z$ included in the memory cell array 110 of FIG. 2 according to an embodiment of the present disclosure.

Referring to FIG. 6, the memory block BLKc includes a plurality of cell strings CS1 to CS$m$. The plurality of cell strings CS1 to CS$m$ may be connected to a plurality of bit lines BL1 to BL$m$, respectively. Each of the cell strings CS1 to CS$m$ includes at least one source select transistor SST, first to n-th memory cells MC1 to MC$n$, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
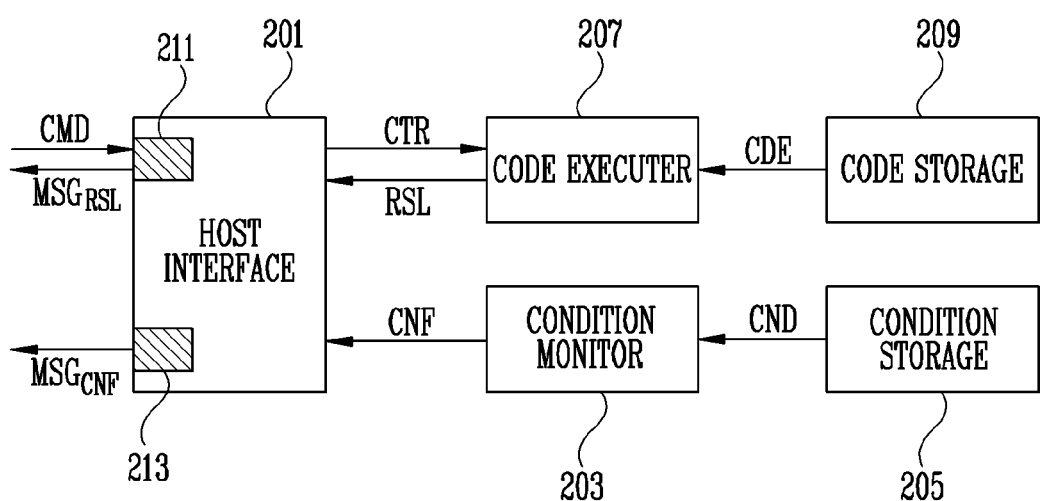
FIG. 7 is a block diagram illustrating the controller of FIG. 1, according to an embodiment of the present disclosure.

FIG. 7 is a block diagram illustrating the controller 200 of FIG. 1, according to an embodiment of the present disclosure.

Referring to FIG. 7, the controller 200 may include a host interface 201, a condition monitor 203, a condition storage 205, a code executer 207, and a code storage 209. The host interface 201 may include the first device port 211 and the second device port 213. As described above with reference to FIG. 1, the first device port 211 may configure the first link 410 together with the first host port 311 of the host 300. The second device port 213 may configure the second link 420 together with the second host port 313 of the host 300.

The host interface 201 may communicate with the host 300. More specifically, the host interface 201 may operate according to a protocol for data exchange between the host 300 and the controller 200. To this end, the host interface 201 may be configured to communicate with the host 300 according to at least one of various interface protocols. As described above, when the controller 200 of the memory system 1000 attempts to transmit data to the host 300 through the first link 410, the command or the request from the host 300 may be required. On the other hand, when the controller 200 of the memory system 1000 attempts to transmit the data to the host 300 through the second link 420, the command or the request from the host 300 may not be required.

The condition monitor 203 may receive at least one of a plurality of conditions CND stored in the condition storage 205. The condition monitor 203 may monitor whether the received condition CND is satisfied. When the received condition CND is satisfied, the condition monitor 203 may transmit to the host interface 201 a confirmation signal CNF indicating that the condition is satisfied. The host interface 201 may generate a condition confirmation message $MSG_{CNF}$ based on the received confirmation signal CNF and transmit the generated condition confirmation message $MSG_{CNF}$ to the host 300. The condition confirmation message $MSG_{CNF}$ may be a message indicating the satisfied condition CND.

At this time, the condition confirmation message $MSG_{CNF}$ may not be a message generated as a response to a command or a message received from the host 300. For example, the condition confirmation message $MSG_{CNF}$ may be a message transmitted from the memory system 1000 to the host 300 through a universal asynchronous receiver and transmitter (UART) interface protocol. Therefore, the condition confirmation message $MSG_{CNF}$ may be transmitted to the second device port 213 and transmitted to the host 300 through the second link 420.

As an example, one of the conditions CND stored in the condition storage 205 may be a condition whether the number of free blocks included in the semiconductor memory device 100 becomes less than a specific threshold value, related to a garbage collection operation. At this time, when the number of free blocks becomes less than the specific threshold value, the condition monitor 203 may transmit the confirmation signal CNF indicating that the corresponding condition is satisfied to the host interface 201, and the host interface 201 may transmit the condition confirmation message $MSG_{CNF}$ indicating that the number of free blocks became less than the specific threshold value to the host 300.

As another example, one of the conditions CND stored in the condition storage 205 may be a condition related to whether an internal temperature of the memory system exceeds a specific threshold temperature. At this time, when the internal temperature of the memory system exceeds the specific threshold temperature, the condition monitor 203 may transmit the confirmation signal CNF indicating that the corresponding condition is satisfied to the host interface 201, and the host interface 201 may transmit the condition confirmation message $MSG_{CNF}$ indicating that the internal temperature of the memory system exceeds the specific threshold temperature to the host 300.

In the above-described example, the condition related to whether the number of free blocks becomes less than the specific threshold value, or the condition related to whether the internal temperature of the memory system 1000 exceeds the specific threshold temperature are described. However, the present disclosure is not limited thereto, and various other conditions may be stored in the condition storage 205 in addition to the conditions described above. At least one of the above-described conditions may be a condition received from the host 300. In this case, the condition storage 205 may store the condition received from the host. As another example, at least one of the above-described conditions may be a condition determined in advance when the memory system 1000 is manufactured. In this case, the condition may be stored in the condition storage 205 when the memory system 1000 is manufactured. As still another example, the condition may be stored in the memory cell array 110 of the semiconductor memory device 100. When the memory system 1000 is turned on, the controller 200 may read the condition stored in the semiconductor memory device 100 and store the condition in the condition storage 205.

The condition storage 205 may be implemented as a volatile memory such as a random access memory (RAM), or may be implemented as a nonvolatile memory such as a read-only memory (ROM) or a flash memory.

The host interface 201 may receive various commands CMD from the host. The host 300 may control the operation of the memory system 1000 by the command CMD. As an example, the command CMD may be a command for controlling the read operation or the write operation of the memory system. In an embodiment, the host 300 may transmit the command to the controller 200 of the memory system 1000 through the first link 410. Therefore, in this case, the first device port 211 of the host interface 201 may receive the command CMD.

According to an embodiment of the present disclosure, the command CMD may direct the memory system 1000 not only to perform a general operation such as a general read operation or write operation but also to execute a specific code among codes stored in the code storage 209 as described above. In this case, the host interface 201 may receive the command CMD to execute a specific code CDE stored in the code storage 209. The host interface 201 may transmit a control signal CTR for executing the code CDE specified by the command CMD to the code executer 207 in response to reception of the command CMD. The code executer 207 may execute at least one code CDE among a plurality of codes stored in the code storage 209 in response to the control signal CTR.

At least one of the codes may be a code received from the host 300. In this case, the code storage 209 may store the code received from the host. As another example, at least one of the codes may be a code determined in advance when the memory system 1000 is manufactured. In this case, the codes may be stored in the code storage 209 when the memory system 1000 is manufactured. As still another example, the codes may be stored in the memory cell array 110 of the semiconductor memory device 100. When the memory system 1000 is turned on, the controller 200 may read the codes stored in the semiconductor memory device 100 and store the codes in the code storage 209.

Similar to the condition storage 205, the code storage 209 may be implemented as a volatile memory such as a random access memory (RAM), or may be implemented as a non-volatile memory such as a read-only memory (ROM) or a flash memory.

The code executer 207 may transmit an execution result RSL to the host interface 201 after execution of the code CDE. The execution result RSL may have various values according to a type of the code CDE. For example, whether the execution of the code CDE is successful or failed may be transmitted to the host interface 201 as the execution result RSL. Alternatively, a specific value may be generated as a result of executing the code CDE. In this case, the code executer 207 may transmit the value generated by the execution of the code CDE to the host interface 201 as the execution result RSL. The host interface 201 transmits an execution result message $MSG_{RSL}$ including information indicated by the received execution result RSL to the host 300. As a result, the memory system 1000 may execute the specific code CDE according to the command CMD received from the host 300, and transmit the execution result message $MSG_{RSL}$ indicating the result of the execution to the host 300. The execution result message $MSG_{RSL}$ may be transmitted to the host 300 in a form of a response to the command CMD. Therefore, the execution result message $MSG_{RSL}$ may be transmitted from the first device port 211 of the host interface 201 to the host 300 through the first link 410.

In many cases, the code storage 209 may store codes for testing the memory system 1000. Among such tests, a test required to be executed when the memory system 1000 satisfies a specific condition may exist.

In a typical case, when the memory system 1000 is required to perform such a test, the host 300 periodically or arbitrarily transmits a confirmation command to the memory system 1000, and the memory system 1000 transmits to the host 300 a message indicating whether the corresponding condition is satisfied as a response to the received confirmation command. In this case, when the memory system 1000 does not satisfy the above-described condition, the host 300 is required to repeatedly transmit the confirmation command through the first link 410 to the memory system 1000. This reduces operation efficiency of the memory system 1000. As the number of conditions that the host 300 attempts to check increases, such inefficiency also increases.

According to embodiments of the present disclosure, without the need for the host 300 to repeatedly check, the memory system 1000 internally monitors whether a specific condition is satisfied, and when the condition is satisfied, the memory system 1000 transmits to the host 300 a message indicating that the condition is satisfied. That is, the memory system 1000 may transmit, to the host 300 through the second link 420 without the request or the command from the host 300, the condition confirmation message $MSG_{CNF}$ indicating that the condition is satisfied. Therefore, the host 300 is not required to repeatedly transmit the command for confirming whether the condition is satisfied to the memory system 1000, and thus the memory system 1000 and the computing system including the same may operate more efficiently.

Figure 8:
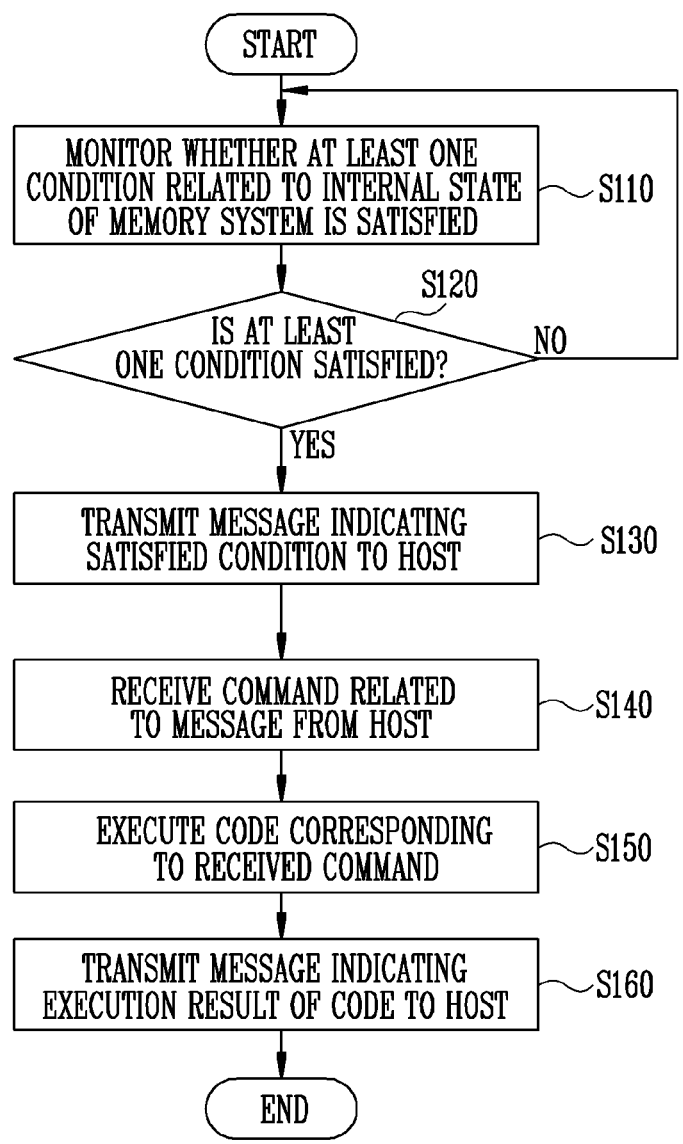
FIG. 8 is a flowchart illustrating a method of operating a memory system according to an embodiment of the present disclosure.

FIG. 8 is a flowchart illustrating a method of operating a memory system according to an embodiment of the present disclosure.

Referring to FIG. 8, the method of operating the memory system includes monitoring whether at least one condition related to an internal state of the memory system 1000 is satisfied (S110), determining whether the at least one condition is satisfied (S120), transmitting a message indicating the satisfied condition to the host 300 (S130), receiving from the host 300 a command related to the message (S140), executing a code corresponding to the received command (S150), and transmitting to the host a message indicating an execution result of the code (S160).

In operation S110, the condition monitor 203 included in the controller 200 of the memory system 1000 may monitor whether at least one of the conditions CND stored in the condition storage 205 is satisfied. The condition monitor 203 may monitor only one condition or may monitor a plurality of conditions simultaneously.

In operation S120, it is determined whether the at least one condition is satisfied. When the condition that satisfies does not exist (S120: No), the method proceeds to operation S110 to continue monitoring the condition.

When at least one condition CND is satisfied (S120: Yes), the condition confirmation message $MSG_{CNF}$ indicating the satisfied condition is transmitted to the host 300 (S130). In operation S130, the memory system 1000 may transmit the condition confirmation message $MSG_{CNF}$ to the host 300 through the second link 420. The host 300 may receive the condition confirmation message $MSG_{CNF}$ and determine the code to be executed by the memory system 1000 in response thereto. In addition, the host 300 may transmit the command CMD that causes the memory system 1000 to execute the determined code to the memory system 1000. An operation of the host 300 receiving the condition confirmation message $MSG_{CNF}$ is described with reference to FIG. 10.

In operation S140, the memory system 1000 may receive the command corresponding to the condition confirmation message $MSG_{CNF}$ from the host 300. In operation S140, the memory system 1000 may receive the command CMD from the host 300 through the first link 410. As described above, the command CMD may correspond to the condition confirmation message $MSG_{CNF}$ and may be a command indicating the code to be executed by the memory system 1000. Accordingly, the memory system 1000 may execute the code identified by the command CMD (S150).

After executing the code identified by the command CMD, the memory system 1000 transmits to the host 300 the execution result message $MSG_{RSL}$ indicating the execution result of the code (S160). When the code is a test code, the execution result message $MSG_{RSL}$ may include information on a test result. In operation S160, the memory system 1000 may transmit the execution result message $MSG_{RSL}$ to the host 300 through the first link 410. The host 300 may receive the execution result message $MSG_{RSL}$, evaluate the test result, and perform a subsequent operation.

Figure 9:
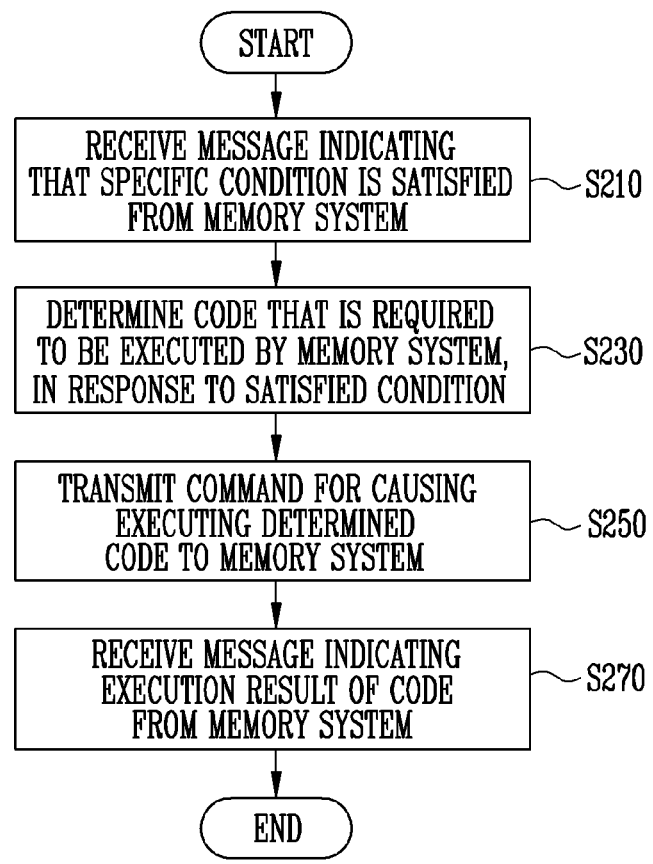
FIG. 9 is a flowchart illustrating a method of operating a host according to another embodiment of the present disclosure.

FIG. 9 is a flowchart illustrating a method of operating a host according to another embodiment of the present disclosure. The host performing the operation according to FIG. 9 may communicate with the memory system 1000 performing the operation according to FIG. 8.

Referring to FIG. 9, the method of operating the host includes receiving from the memory system 1000 the message indicating that the specific condition is satisfied (S210), determining in response to the message the code to be executed by the memory system (S230), transmitting to the memory system 1000 the command for executing the determined code (S250), and receiving from the memory system 1000 the message indicating the execution result of the code (S270).

In operation S130 of FIG. 8, the memory system 1000 transmits the condition confirmation message $MSG_{CNF}$ to the host 300. Therefore, the host 300 receives the condition confirmation message $MSG_{CNF}$ from the memory system 1000 (S210). In operation S210, the host 300 may receive the condition confirmation message $MSG_{CNF}$ through the second host port 313 configuring the second link 420.

In operation S230, the host 300 analyzes the received condition confirmation message $MSG_{CNF}$ and determines the code that is required to be executed by the memory system 1000. Regarding the test, the host 300 may determine test related codes that may be executed when a state of the memory system 1000 satisfies the specific condition.

In operation S250, the host 300 transmits to the memory system 1000 the command CMD for causing the memory system 1000 to execute the code determined in operation S230. In operation S250, the host 300 may transmit the command CMD to the memory system 1000 through the first host port 311 configuring the first link 410. As operation S250 is performed, the memory system may receive the command CMD in operation S140 of FIG. 8.

Thereafter, as shown in FIG. 8, the memory system 1000 executes the code corresponding to the command CMD (S150) and transmits to the host the execution result message $MSG_{RSL}$ indicating the execution result of the code (S160). As operation S160 of FIG. 8 is performed, in operation S270 of FIG. 9, the host 300 may receive from the memory system the execution result message $MSG_{RSL}$ indicating the execution result of the code. In operation S270, the host 300 may receive the execution result message $MSG_{RSL}$ through the first host port 311 configuring the first link 410. When the code is the code for the test operation of the memory system 1000, the host 300 may receive the execution result message $MSG_{RSL}$ as a test execution result. As a result, the host 300 may analyze the execution result message $MSG_{RSL}$ and evaluate the test execution result of the memory system 1000.

Figure 10:
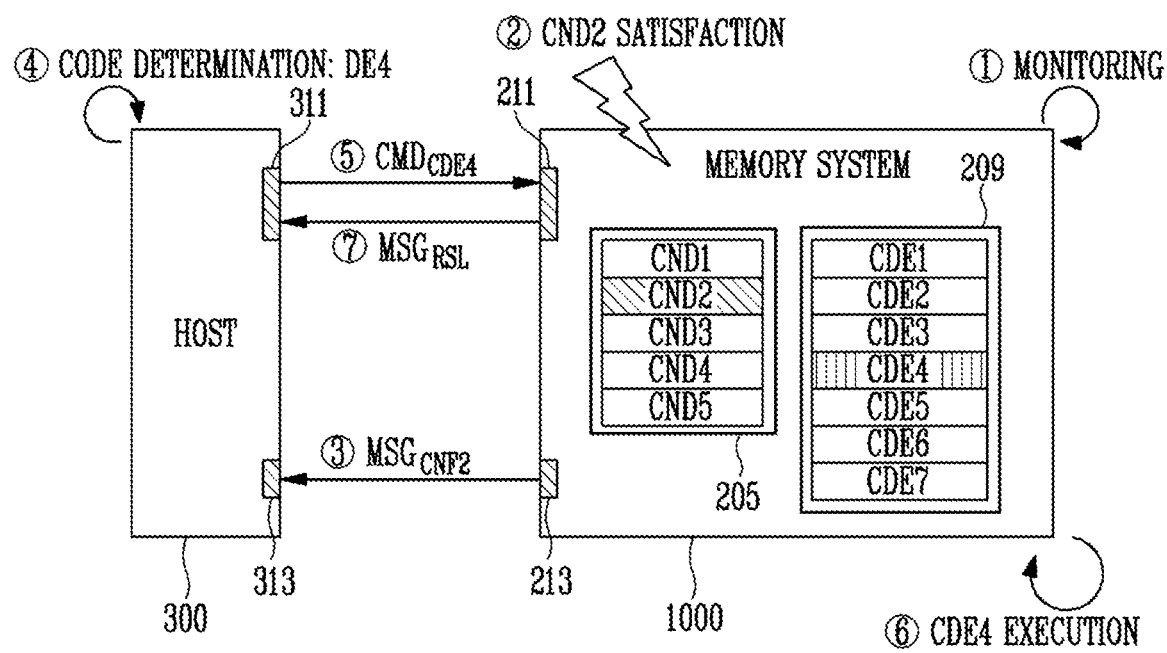
FIG. 10 is a block diagram illustrating the operation of the memory system and the host illustrated in FIGS. 8 and 9 according to an embodiment of the present disclosure.

FIG. 10 is a block diagram illustrating the operation of the memory system and the host illustrated in FIGS. 8 and 9 according to an embodiment of the present disclosure. FIG. 10 is a diagram illustrating a combination of the method of operating the memory system according to FIG. 8 and the method of operating the host according to FIG. 9. In FIG. 10, only the condition storage 205, the code storage 209, the first device port 211 and the second device port 213 in the controller 200 of the memory system 1000 are shown, and other components are omitted for convenience of description. In FIG. 10, first to fifth conditions CND1 to CND5 are stored in the condition storage 205, and first to seventh codes CDE1 to CDE7 are stored in the code storage 209. This is an example, and various conditions and codes may be stored in the condition storage 205 and the code storage 209.

First, according to operation S110 of FIG. 8, the memory system 1000 may continuously monitor whether at least one condition among the plurality of conditions CND1 to CND5 stored in the condition storage 205 is satisfied (①). In the middle of monitoring the conditions, when any condition, for example, the second condition CND2 is satisfied (②, S120: Yes), the memory system 1000 transmits to the host through the second device port 213 configuring the second link 420 a condition confirmation message $MSG_{CNF2}$ indicating that the second condition CND2 is satisfied (③), S130).

In FIG. 10, an embodiment in which the condition confirmation message $MSG_{CNF2}$ indicating that the second condition CND2 is satisfied is transmitted to the host 300 when the second condition CND2 among the plurality of conditions CND1 to CND5 is satisfied is shown. However, this is an example, and when a plurality of conditions are satisfied, a condition confirmation message indicating that the plurality of conditions are satisfied may be transmitted to the host 300. In this case, a combination of a plurality of conditions may be variously determined as necessary.

The host 300 receives the condition confirmation message $MSG_{CNF2}$ from the second host port 313 configuring the second link 420 (S210), and determines the code required to be executed by the memory system 1000 in response to the received condition confirmation message $MSG_{CNF2}$ (S230). For example, as the second condition CND2 of the memory system 1000 is satisfied, the host 300 may determine that the fourth code CDE4 is to be executed among the first to seventh codes CDE1 to CDE7 (④). The host 300 may generate a command $CMD_{CDE4}$ for executing the determined fourth code CDE4, and transmit the generated command $CMD_{CDE4}$ to the memory system 1000 through the first host port 311 (⑤, S250).

The memory system 1000 receives the command $CMD_{CDE4}$ for executing the fourth code CDE4 from the host 300 through the first device port 211 (S140). In response to the received command $CMD_{CDE4}$, the memory system 1000 executes the fourth code CDE4 (⑥, S150). Thereafter, the memory system 1000 transmits a result of executing the fourth code CDE4 as the execution result message $MSG_{RSL}$ to the host 300 through the first device port 211 (⑦, S160). Accordingly, the host 300 may receive the execution result message $MSG_{RSL}$ from the memory system 1000 through the first host port 311 (S270), and analyze the execution result message $MSG_{RSL}$ to evaluate or perform another subsequent operation.

Figure 11:
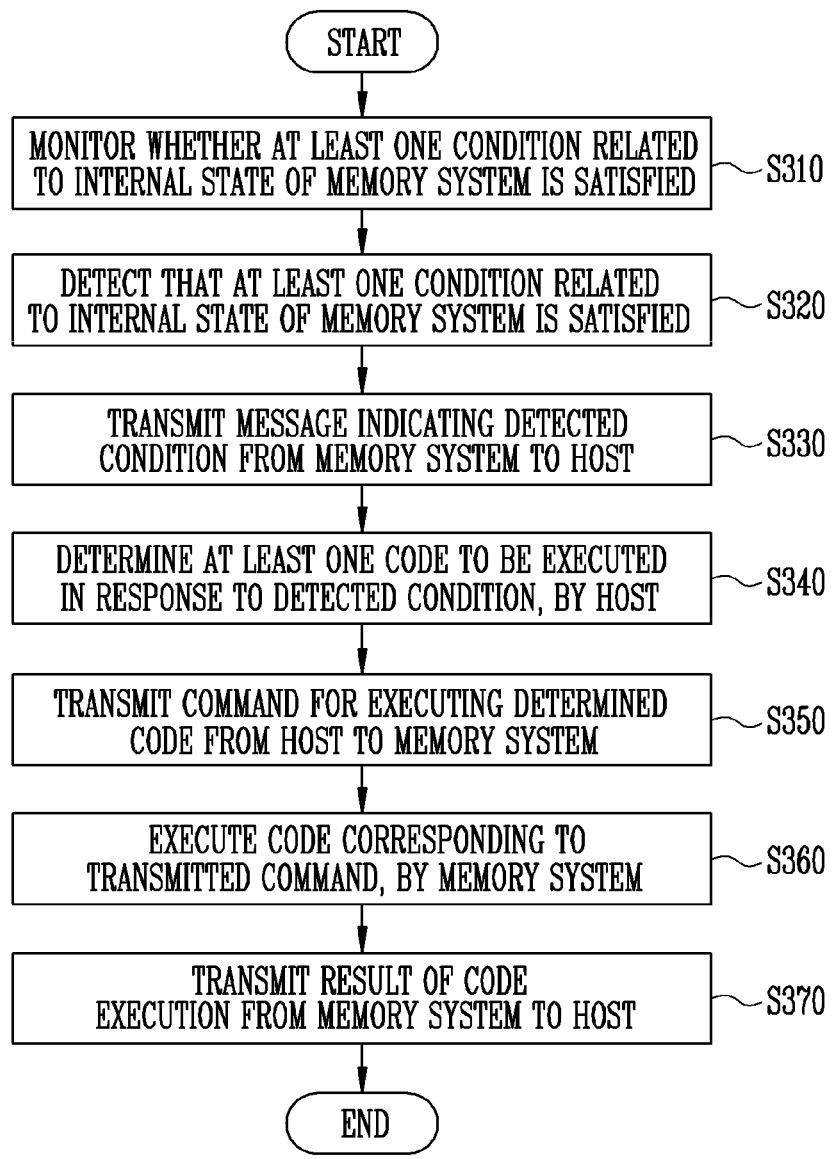
FIG. 11 is a flowchart illustrating a method of operating a computing system according to still another embodiment of the present disclosure.

FIG. 11 is a flowchart illustrating a method of operating a computing system according to still another embodiment of the present disclosure. The computing system may include the memory system 1000 and the host 300. Referring to FIG. 11, the method of operating the computing system includes monitoring, by the memory system 1000, whether at least one condition related to an internal state of the memory system 1000 is satisfied (S310); detecting, by the memory system 1000, that at least one condition related to the internal state is satisfied (S320); transmitting, by the memory system 1000, a message indicating the detected condition to the host 300 (S330); determining, by the host 300, at least one code to be executed in response to the detected condition (S340); transmitting, by the host 300, a command for executing the determined code to the memory system (S350); executing, by the memory system 1000, the code corresponding to the transmitted command (S360); and transmitting, by the memory system 1000, a result of the code execution to the host 300 (S370).

According to an embodiment of the present disclosure, the condition confirmation message $MSG_{CNF}$ indicating the condition detected in operation S330 may be transmitted from the memory system 1000 to the host 300 through the second link 420. Therefore, the request or the command from the host 300 is not required as a prerequisite for performing operation S330.

According to an embodiment of the present disclosure, the command CMD for executing the code determined in operation S340 may be transmitted from the host 300 to the memory system 1000 through the first link 410. In addition, the execution result message $MSG_{RSL}$ indicating the execution result of the code determined in operation S370 may be transmitted from the memory system 1000 to the host 300 through the first link 410.

FIG. 11 illustrates from a viewpoint of the computing system, a combination of the method of operating the memory system shown in FIG. 8 and the method of operating the host shown in FIG. 9. That is, operation S310 of FIG. 11 corresponds to operation S110 of FIG. 8, and operation S320 of FIG. 11 corresponds to operation S120 of FIG. 8. In addition, operation S330 of FIG. 11 corresponds to operation S130 of FIGS. 8 and operation S210 of FIG. 9, and operation S340 of FIG. 11 corresponds to operation S230 of FIG. 9. Additionally, operation S350 of FIG. 11 corresponds to operation S250 of FIG. 9 and operation S140 of FIG. 8, and operation S360 of FIG. 11 corresponds to operation S150 of FIG. 8. Finally, operation S370 of FIG. 11 corresponds to operation S160 of FIG. 8 and operation S270 of FIG. 9.

Figure 12:
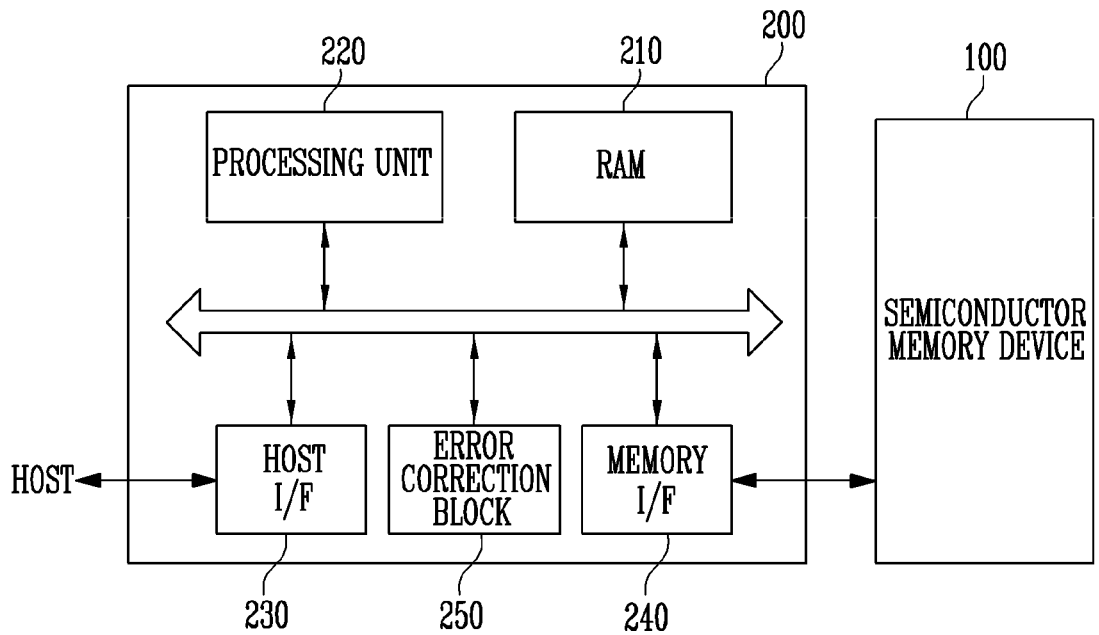
FIG. 12 is a block diagram illustrating an example of a controller shown in FIG. 1 according to an embodiment of the present disclosure.

FIG. 12 is a block diagram illustrating an example of the controller 200 shown in FIG. 1, according to an embodiment of the present disclosure.

Referring to FIG. 12, the controller 200 is connected to the semiconductor memory device 100 and a host HOST. The semiconductor memory device 100 may be the semiconductor memory device described with reference to FIG. 2. The controller 200 corresponds to the controller 200 of FIG. 1 or 7. Hereinafter, a repetitive description is omitted.

The controller 200 is configured to access the semiconductor memory device 100 in response to a request from the host Host. For example, the controller 200 is configured to control read, write, erase, and background operations of the semiconductor memory device 100. The controller 200 is configured to provide an interface between the semiconductor memory device 100 and the host Host. The controller 200 is configured to drive firmware for controlling the semiconductor memory device 100.

The controller 200 includes a random access memory (RAM) 210, a processing unit 220, a host interface 230, a memory interface 240, and an error correction block 250. The RAM 210 is used as at least one of an operation memory of the processing unit 220, a cache memory between the semiconductor memory device 100 and the host Host, and a buffer memory between the semiconductor memory device 100 and the host Host. As an example, at least one of the condition storage 205 and the code storage 209 of FIG. 7 may be implemented as the RAM 210 of FIG. 12. As another example, at least one of the condition storage 205 and the code storage 209 of FIG. 7 may be implemented as a read-only memory (ROM) that is not shown in FIG. 12.

The processing unit 220 controls an overall operation of the controller 200. The processing unit 220 of FIG. 12 may drive the firmware of the controller 200. In this case, the condition monitor 203 and the code executer 207 of FIG. 7 may be implemented as the firmware driven by the processing unit 220.

The host interface 230 includes a protocol for performing data exchange between the host Host and the controller 200. In an embodiment, the controller 200 is configured to communicate with the host Host through at least one of various communication standards or interfaces such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol. For example, the above-described first link 410 may be configured to use the protocol listed above. The host interface 230 of FIG. 12 may be substantially the same component as the host interface 201 of FIG. 7. In an embodiment of the present disclosure, the host interface 230 may include a universal asynchronous receiver and transmitter (UART). In this case, the second link 420 may use a UART protocol.

The memory interface 240 interfaces with the semiconductor memory device 100. For example, the memory interface 1240 includes a NAND interface or a NOR interface.

The error correction block 250 is configured to detect and correct an error of data received from the semiconductor memory device 100 using an error correcting code (ECC). The processing unit 220 may control the semiconductor memory device 100 to adjust a read voltage and perform re-read according to an error detection result of the error correction block 250. In an embodiment, the error correction block may be provided as a component of the controller 200.

The controller 200 and the semiconductor memory device 100 may be integrated into one semiconductor device. In an embodiment, the controller 200 and the semiconductor memory device 100 may be integrated into one semiconductor device to form a memory card. For example, the controller 200 and the semiconductor memory device 100 may be integrated into one semiconductor device to form a memory card such as a PC card (personal computer memory card international association (PCMCIA)), a compact flash (CF) card, a smart media card (e.g., SM or SMC), a memory stick, a multimedia card (e.g., MMC, RS-MMC, or MMC-micro), a secure digital SD card (e.g., SD, miniSD, microSD, or SDHC), and a universal flash storage (UFS).

The controller 200 and the semiconductor memory device 100 may be integrated into one semiconductor device to form a semiconductor drive (solid state drive (SSD)). The semiconductor drive (SSD) includes the memory system 1000 configured to store data in a semiconductor memory. When the memory system 1000 including the controller 200 and the semiconductor memory device 100 is used as the semiconductor drive (SSD), an operation speed of the host connected to the memory system 1000 is dramatically improved.

In another example, the memory system 1000 including the controller 200 and the semiconductor memory device 100 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 100, the controller 200, and the memory system 1000 including the same may be mounted as a package of various types. For example, the semiconductor memory device 100 or the memory system may be packaged and mounted as a package such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 13:
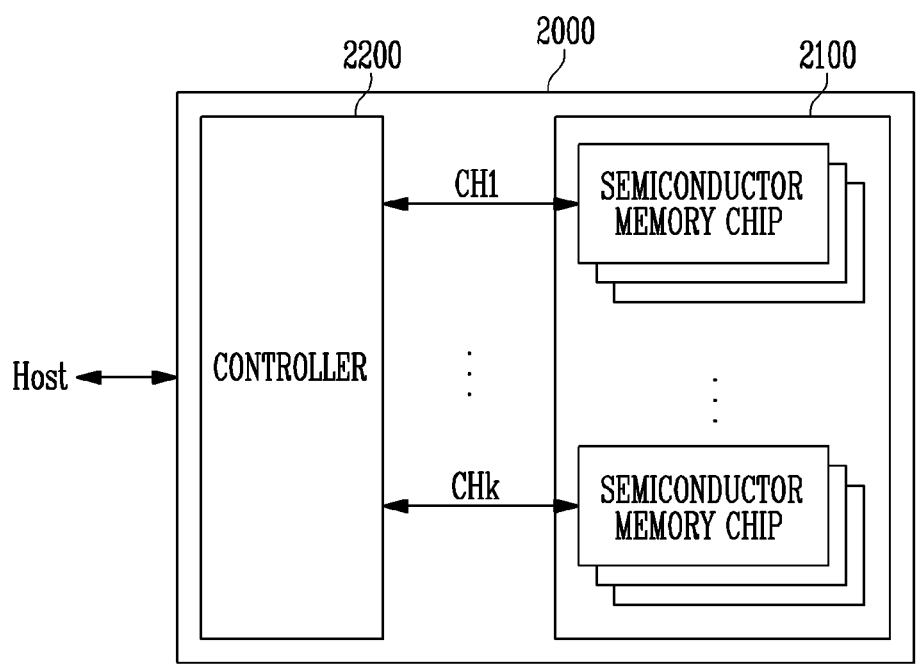
FIG. 13 is a block diagram illustrating an application example of the memory system of FIG. 1 according to an embodiment of the present disclosure.

FIG. 13 is a block diagram illustrating an application example of the memory system of FIG. 1, according to an embodiment of the present disclosure.

Referring to FIG. 13, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 13, the plurality of groups communicate with the controller 2200 through first to k-th channels CH1 to CHk, respectively. Each semiconductor memory chip is configured and is operated similarly to that of the semiconductor memory device 100 described with reference to FIG. 2.

Each group is configured to communicate with the controller 2200 through one common channel. The controller 2200 is configured similarly to the controller 200 described with reference to FIG. 12 and is configured to control the plurality of memory chips of the semiconductor memory device 2100 through the plurality of channels CH1 to CHk.

Figure 14:
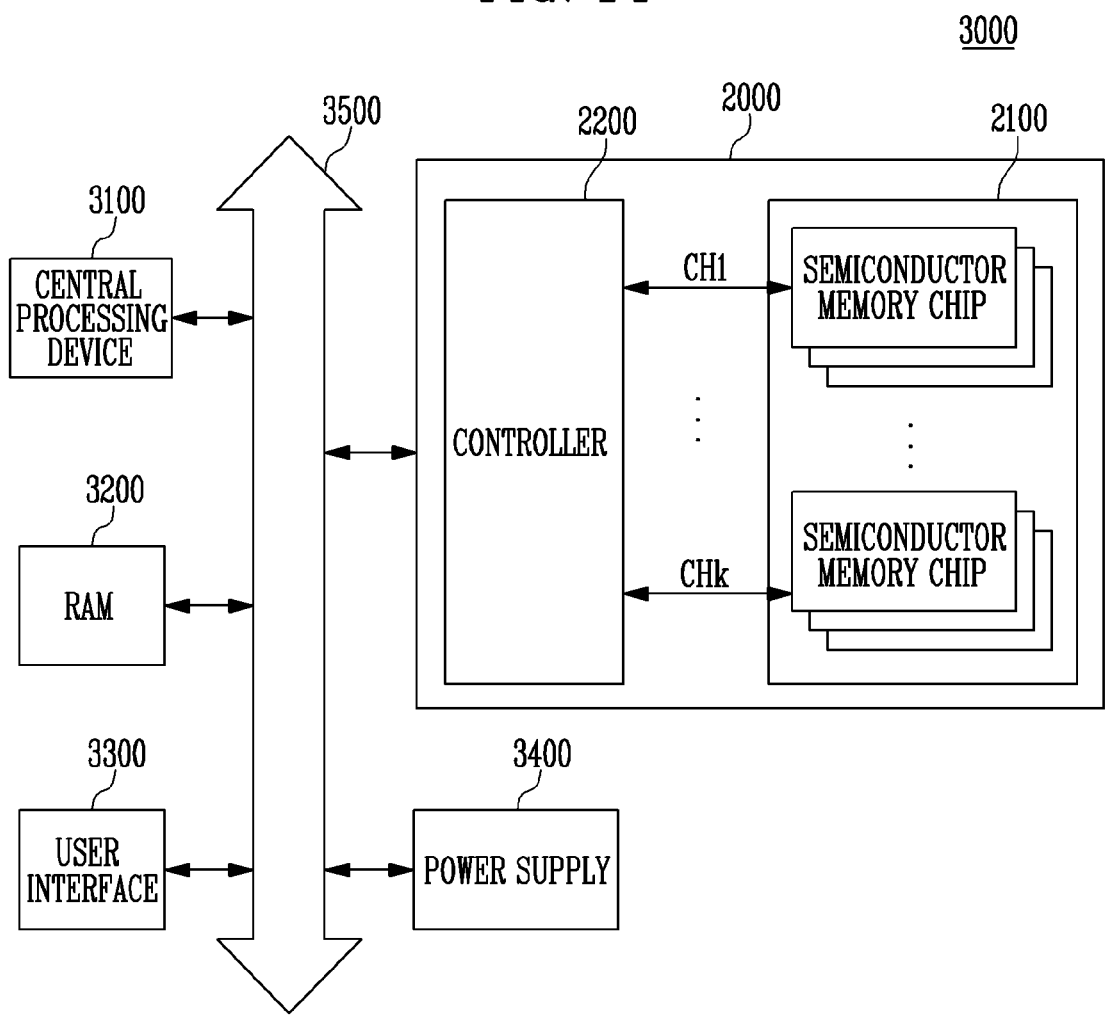
FIG. 14 is a block diagram illustrating a computing system including the memory system described with reference to FIG. 13 according to an embodiment of the present disclosure.

FIG. 14 is a block diagram illustrating a computing system 3000 including the memory system described with reference to FIG. 13, according to an embodiment of the present disclosure.

The computing system 3000 includes a central processing device 3100, a random access memory (RAM) 3200, a user interface 3300, a power supply 3400, a system bus 3500, and the memory system 2000.

The memory system 2000 is electrically connected to the central processing device 3100, the RAM 3200, the user interface 3300, and the power supply 3400 through the system bus 3500. Data provided through the user interface 3300 or processed by the central processing device 3100 is stored in the memory system 2000.

In FIG. 14, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 14, among the components of the computing system 3000, the central processing device 3100, the RAM 3200, the user interface 3300, the power source 3400, and the system bus 3500 which are other components except for the memory system 2000 may configure a host. That is, the host and the memory system 2000 communicating with the host may configure the computing system 3000 of FIG. 14.

In FIG. 14, the memory system 2000 described with reference to FIG. 13 is provided. However, the memory system 2000 may be replaced with the memory system including the controller 200 and the semiconductor memory device 100 described with reference to FIG. 12.

The embodiments of the present disclosure disclosed in the present specification and drawings are merely provided with specific examples to easily describe the technical content of the present disclosure and to help understanding of the present disclosure, and are not intended to limit the scope of the present disclosure. It should be apparent to those of ordinary skill in the art that other modified examples based on the technical spirit of the present disclosure may be implemented in addition to the embodiments disclosed herein and the following claims. Furthermore, the embodiments may be combined to form additional embodiments.

What is claimed is:

1. A memory system communicating with a host, the memory system comprising:
    a semiconductor memory device including a plurality of memory cells; and
    a controller configured to control an operation of the semiconductor memory device and communicate with the host,
    wherein the controller comprises:
    a condition storage configured to store at least one condition related to an internal state of the memory system;
    a code storage configured to store at least one code for performing a test operation of the memory system;
    a condition monitor configured to monitor whether the at least one condition, which is related to the internal state of the memory system and associated with the at least one code, is satisfied, and output a confirmation signal when the at least one condition is satisfied; and
    a host interface configured to output, to the host, a condition confirmation message indicating that the at least one condition related to the internal state of the memory system is satisfied, in response to the confirmation signal, to cause the host to determine the at least one code for the test operation to be performed by the memory system,
    wherein the controller is configured to execute the at least one code for the test operation determined by the host based on the condition confirmation message, and
    wherein the host interface is further configured to transmit an execution result message, indicating a result of executing the at least one code, to the host.

2. The memory system of claim 1, wherein the at least one condition is provided from the host and stored in the condition storage.

3. The memory system of claim 1, wherein the at least one condition is stored in the condition storage when the memory system is manufactured.

4. The memory system of claim 1, wherein the controller further comprises:
   a code executer configured to execute the at least one code.

5. The memory system of claim 4,
   wherein the host interface comprises:
   a first port for exchanging data of a first type and a command with the host; and
   a second port for exchanging data of a second type with the host, and
   wherein the controller outputs the condition confirmation message through the second port.

6. The memory system of claim 5, wherein the host interface is further configured to:
   receive, from the host through the first port, a command for identifying a code to be executed which corresponds to the satisfied condition, and
   output a control signal for controlling the code executer to execute the code identified by the command.

7. The memory system of claim 6,
   wherein the code executer executes the code identified by the command in response to the control signal, and
   wherein the code executer is further configured to transmit, to the host interface, a result of executing the code.

8. The memory system of claim 7, wherein the host interface is further configured to transmit the execution result message indicating the result of executing the code to the host through the first port.

9. The memory system of claim 8, wherein the result of executing the code indicates a success or a failure of executing the code.

10. The memory system of claim 5, wherein the second port configures a communication link with the host, the communication link using a universal asynchronous receiver/transmitter (UART) protocol.

11. A method of operating a host exchanging data of a first type and a command through a first link with a memory system, the method comprising:
    receiving, from the memory system through a second link, a first message indicating that a condition related to an internal state of the memory system is satisfied, the second link different from the first link;
    determining a code, which is associated with the condition, to be executed by the memory system for performing a test operation, in response to the first message; and
    transmitting a command identifying the code to the memory system through the first link,
    wherein the host determines, based on a condition confirmation message, codes to be performed by the memory system for the test operation of the memory system, and
    wherein an execution result message, indicating a result of executing the at least one code, is transmitted to the host.

12. The method of claim 11, further comprising receiving, from the memory system through the first link, a second message indicating the result of executing the at least one code.

13. The method of claim 11, wherein the second link uses a universal asynchronous receiver/transmitter (UART) protocol.

14. A method of operating a memory system communicating with a host through a first link for transmitting and receiving data of a first type and a command, and a second link for transmitting and receiving data of a second type, the method comprising:
    detecting that at least one condition, which is related to an internal state of the memory system and associated with at least one code for performing a test operation of the memory system, is satisfied with respect to the memory system;
    transmitting, to the host through the second link, a first message indicating the detected condition that is satisfied with respect to the memory system, to cause the host to determine the at least one code for the test operation to be performed by the memory system and to generate a command corresponding to the at least one code;
    receiving a command corresponding to the first message transmitted from the host; and
    executing the at least one code corresponding to the received command, and
    wherein an execution result message, indicating a result of executing the at least one code, is transmitted to the host.

15. The method of claim 14, further comprising:
    transmitting, to the host through the first link, the data of the first type in response to a command of the host associated with the data of the first type.

16. The method of claim 14, further comprising:
    transmitting, to the host through the second link, the data of the second type.

17. The method of claim 14, further comprising:
    transmitting, to the host through the first link, a second message indicating the result of executing the at least one code.

18. The method of claim 17, wherein the result of executing the at least one code indicates a success or a failure of executing the at least one code.

19. An operating method of a system communicating with a host, the operating method comprising:
    providing, the host with a message indicating that a condition, which is related to an internal state of the system and associated with a test operation of the system, is satisfied, to cause the host to generate a request for the test operation to be performed by the system;
    receiving the request corresponding to the message, from the host; and
    performing, in response to the request, which is corresponding to the message, provided from the host, the test operation to provide the host with a result of the test operation,
    wherein the message is provided through a second link according to a universal asynchronous receiver/transmitter (UART) protocol,
    wherein the request and the result are provided through a first link, and
    wherein an execution result message, indicating the result of the test operation, is transmitted to the host.

* * * * *